US012033699B2

(12) United States Patent
Lue et al.

(10) Patent No.: US 12,033,699 B2
(45) Date of Patent: Jul. 9, 2024

(54) MEMORY DEVICE AND OPERATION METHOD THEREOF FOR PERFORMING MULTIPLY ACCUMULATE OPERATION

(71) Applicant: MACRONIX INTERNATIONAL CO., LTD., Hsinchu (TW)

(72) Inventors: Hang-Ting Lue, Hsinchu (TW); Po-Kai Hsu, Tainan (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 108 days.

(21) Appl. No.: 17/475,424

(22) Filed: Sep. 15, 2021

(65) Prior Publication Data

US 2022/0246212 A1 Aug. 4, 2022

Related U.S. Application Data

(60) Provisional application No. 63/144,477, filed on Feb. 2, 2021.

(51) Int. Cl.
| | |
|---|---|
| *G11C 16/04* | (2006.01) |
| *G06F 7/544* | (2006.01) |
| *G11C 16/08* | (2006.01) |
| *H03M 1/12* | (2006.01) |

(52) U.S. Cl.
CPC ............ *G11C 16/04* (2013.01); *G06F 7/5443* (2013.01); *G11C 16/08* (2013.01); *H03M 1/12* (2013.01)

(58) Field of Classification Search
CPC ......... G11C 16/04; G11C 16/08; G11C 16/24; G11C 11/5621; G11C 11/54; G11C 16/0425; G11C 16/0483; G11C 8/14; G06F 7/5443; H03M 1/12
See application file for complete search history.

(56) References Cited

U.S. PATENT DOCUMENTS

| | | | |
|---|---|---|---|
| 10,748,603 B2* | 8/2020 | Sumbul | G06N 3/065 |
| 11,087,207 B2 | 8/2021 | Tran et al. | |
| 11,289,164 B2* | 3/2022 | Tran | G11C 11/54 |
| 2019/0237142 A1 | 8/2019 | Tran et al. | |
| 2019/0287610 A1* | 9/2019 | Oda | G11C 11/419 |
| 2020/0411066 A1* | 12/2020 | Choi | G06F 17/16 |
| 2021/0117500 A1* | 4/2021 | Qin | G11C 13/0028 |

(Continued)

FOREIGN PATENT DOCUMENTS

TW 201941209 A 10/2019

OTHER PUBLICATIONS

Wikipedia.org/wiki/Adder, Adder (electronics) (Year: 2023).*

*Primary Examiner* — Donald H B Braswell
(74) *Attorney, Agent, or Firm* — McClure, Qualey & Rodack, LLP (57) ABSTRACT

A memory device and an operation method thereof are provided. The operation method comprises: in performing a multiply accumulate (MAC) operation, inputting a plurality of inputs into a plurality of memory cells via a plurality of first signal lines; outputting a plurality of cell currents from the memory cells to a plurality of second signal lines based on a plurality of weights of the memory cells; summing the cell currents on each of the second signal lines into a plurality of signal line currents: summing the signal line currents into a global signal line current: and converting the global signal line current into an output, wherein the output represents a MAC operation result of the inputs and the weights.

14 Claims, 5 Drawing Sheets

(56) References Cited

U.S. PATENT DOCUMENTS

2021/0326110 A1* 10/2021 Ma .......................... G11C 11/54
2022/0027723 A1*  1/2022 Kolter .................... G06N 3/063
2022/0156045 A1*  5/2022 Nazar .................... G06N 3/065

* cited by examiner

MEMORY DEVICE AND OPERATION METHOD THEREOF FOR PERFORMING MULTIPLY ACCUMULATE OPERATION

This application claims the benefit of US provisional application Ser. No. 63/144,477, filed Feb. 2, 2021, the subject matter of which is incorporated herein by reference.

TECHNICAL FIELD

The disclosure relates in general to a memory device and an operation method thereof.

BACKGROUND

Artificial intelligence (AI) is gradually important. Multiply accumulate (MAC) operations are core of AI.

In tradition, for completing MAC operations, arithmetic logic units (ALU), floating point units (FPU) are used to perform operations by accessing data from memories. This needs a large amount of data movements between memories and thus the operation speed may be slow.

Now, Computing-in-Memory (CIM) memories are developed to fast perform MAC operations, which is suitable for AI accelerator.

3D (three-dimension) stacking is developed in memory technical field for improving memory storage density. For 3D structure, in addition to 3D NAND type flash memories and 3D NOR type flash memories, 3D AND type flash memories are also developed.

It is one major effort to improve MAC operations without occupying additionally large circuit area in 3D memory.

SUMMARY

According to one embodiment, a memory device is provided. The memory device comprises: a memory array including a plurality of memory cells, the memory cells storing a plurality of weights, the memory cells being coupled to a plurality of word lines, a plurality of first signal lines and a plurality of second signal lines, the plurality of memory cells are controlled by the plurality of word lines; a local signal line decoder coupled to the memory array and a global signal line; and a conversion unit coupled to the local signal line decoder and the global signal line. In performing a multiply accumulate (MAC) operation, a plurality of inputs are input into the memory cells via the word lines; the memory cells output a plurality of cell currents to the second signal lines based on the weights of the memory cells; the cell currents on each of the second signal lines are summed into a plurality of signal line currents and input into the local signal line decoder; the local signal line decoder sums the signal line currents into a global signal line current; the conversion unit converts the global signal line current from the local signal line decoder into an output, wherein the output represents a MAC operation result of the inputs and the weights. In presenting x-level weight, a number of the second signal lines coupled to the same conversion unit is expressed as: $Q=2^x-1$, x and Q are both positive integers, Q is the number of the second signal lines coupled to the same conversion unit. The memory cells are single-level storage cells.

According to another embodiment, provided is an operation method for a memory device, the operation method comprising: in performing a multiply accumulate (MAC) operation, inputting a plurality of inputs into a plurality of memory cells via a plurality of word lines, the plurality of memory cells are controlled by the plurality of word lines; outputting a plurality of cell currents from the memory cells to a plurality of second signal lines based on a plurality of weights of the memory cells; summing the cell currents on each of the second signal lines into a plurality of signal line currents; summing the signal line currents into a global signal line current; converting the global signal line current into an output by a conversion unit, wherein the output represents a MAC operation result of the inputs and the weights. In presenting x-level weight, a number of the second signal lines coupled to the same conversion unit is expressed as: $Q=2^x-1$, x and Q are both positive integers, Q is the number of the second signal lines coupled to the same conversion unit. The memory cells are single-level storage cells.

According to yet another embodiment, provided is a memory device comprising: a memory array including a plurality of memory cells, the memory cells storing a plurality of weights, the memory cells being coupled to a plurality of word lines, a plurality of first signal lines and a plurality of second signal lines, the plurality of memory cells are controlled by the plurality of word lines; at least one first local signal line decoder coupled to the memory array and at least one first global signal line; and at least one conversion unit coupled to the at least one first local signal line decoder and the at least one first global signal line. Wherein in presenting x-level weight, a number of the second signal lines coupled to the same conversion unit is expressed as: $Q=2^x-1$, x and Q are both positive integers, Q is the number of the second signal lines coupled to the same conversion unit. The memory cells are single-level storage cells.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1:
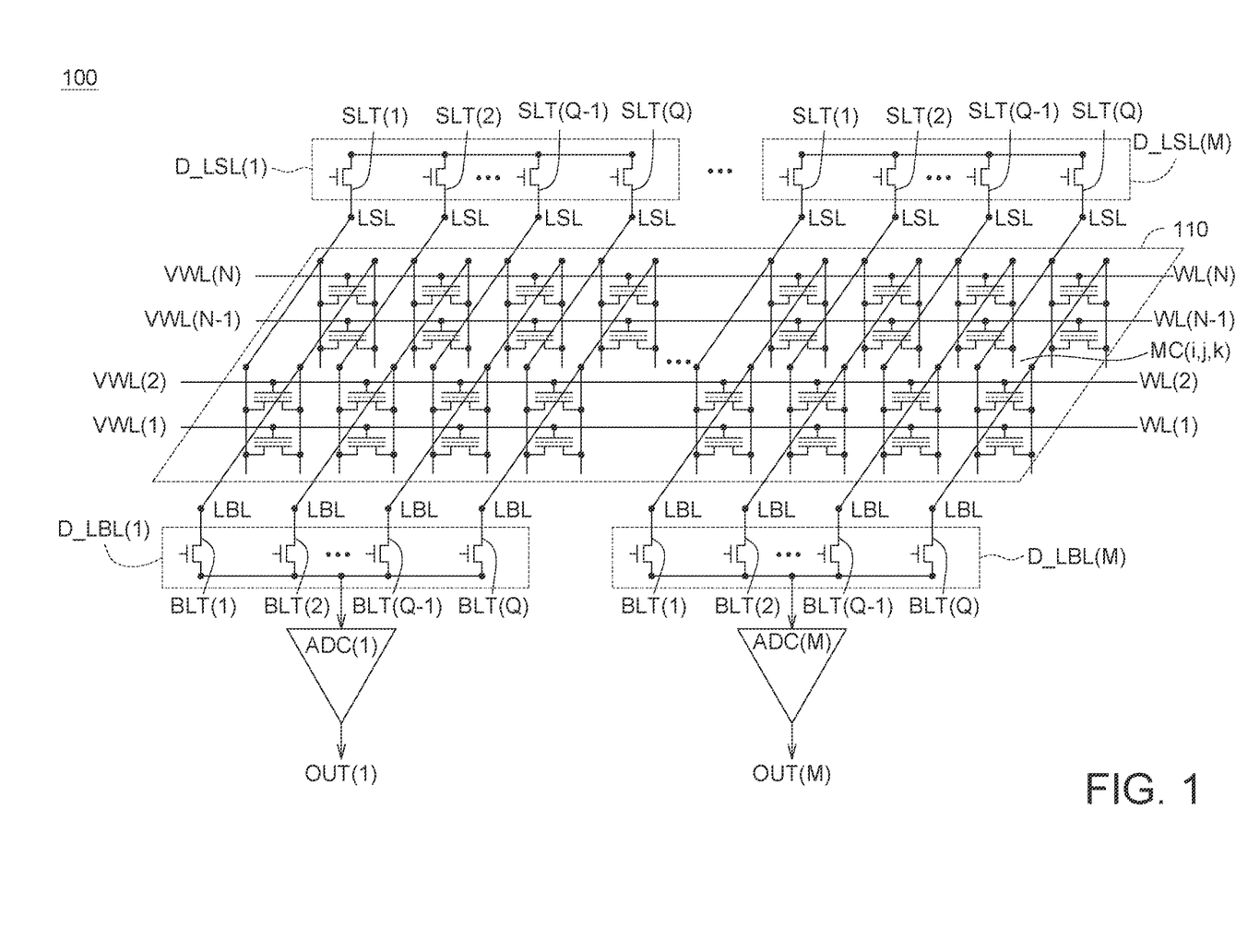
FIG. 1 shows a circuit diagram of a memory device according to one embodiment of the application.

FIG. 1 shows a circuit diagram of a memory device according to one embodiment of the application. As shown in FIG. 1, the memory device 100 according to one embodiment of the application includes a memory array 110, a plurality of local bit line decoders D_LBL(1)~D_LBL(M) (M being a positive integer), a plurality of local source line decoders D_LSL(1)~D_LSL(M) and a plurality of conversion units ADC(1)~ADC(M). Here, the conversion units are implemented by analog-to-digital converters (ADC) but the application is not limited by this. The memory device 100 is for example but not limited by a 3D AND type flash memory and the memory array 110 is a 3D AND type flash memory array.

Each of the local bit line decoders D_LBL(1)~D_LBL(M) includes a plurality of bit line transistors BLT(1)~BLT(Q) (Q being a positive integer). Similarly, each of the local source line decoders D_LSL(1)~D_LSL(M) includes a plurality of source line transistors SLT(1)~SLT(Q).

The memory array 110 includes a plurality of memory cells MC(i, j, k) arranged in an array. The memory cells MC(i, j, k) are coupled to a plurality of word lines WL(1)~WL(N) (N being a positive integer), a plurality of local source lines LSL and a plurality of local bit lines LBL, wherein i=1~N, k=1~Q, and i, j, and k are positive integers.

Taking the bit line transistor BLT(1) as an example, the bit line transistor BLT(1) includes a first terminal (for example the source terminal) coupled to the local bit line LBL, a second terminal (for example the drain terminal) coupled to a global bit line (not shown) and an input of the conversion unit and a control terminal (for example the gate terminal) for receiving a control signal (not shown). The bit line transistors BLT(2)~BLT(Q) have similar coupling relationships.

Taking the source line transistor SLT(1) as an example, the source line transistor SLT(1) includes a first terminal (for example the source terminal) coupled to the local source line LSL, a second terminal (for example the drain terminal) coupled to a global source line (not shown) and a control terminal (for example the gate terminal) for receiving a control signal (not shown). The source line transistors SLT(2)~SLT(Q) have similar coupling relationships.

In MAC operations, the word lines WL(1)~WL(N) receive a plurality of word line voltages VWL(1)~VWL(N) wherein the word line voltages VWL(1)~VWL(N) are high-level voltages or low-level voltages. In MAC operations, the word line voltages VWL(1)~VWL(N) are the inputs.

The memory cells may be programmed as logic 1 or logic 0. In other words, the memory cells may be implemented by single-level cells (SLC), but the application is not limited by this. In other possible embodiment, the memory cells may be implemented by multi-level cells (MLC) etc., which is still within the spirit and scope of the application. When the memory cell is programmed as logic 1 and the corresponding word line is applied by the high-level voltage, the memory cell outputs a cell current. When the memory cell is programmed as logic 1 and the corresponding word line is applied by the low-level voltage, the memory cell outputs no cell current. When the memory cell is programmed as logic 0, the memory cell outputs no cell current no matter the corresponding word line is applied by the high-level voltage or the low-level voltage. The cell current Icell(i, j, k) generated by the memory cell MC(i, j, k) may be represented as: Icell(i, j, j, k)=VWL(i)*w(i, j, k), wherein w(i, j, k) represents the weight stored in the memory cell MC(i, j, k), i.e, the transconductance of the memory cell MC(i, j, k).

Thus, as for the same local bit line LBL, the bit line current (i.e. the signal line current) from the local bit line LBL to the conversion unit ADC(j) is the summation of the cell currents from the N memory cells on the local bit line LBL.

Each of the local bit line decoders D_LBL(1)~D_LBL(M) sums the bit line currents (i.e. the signal line currents) from the local bit lines LBL into a global bit line current (i.e. a global signal line current). Thus, the global bit line current is represented as: $\Sigma_{i=1}^{i=N}\Sigma_{k=1}^{k=Q}$ VWL(i)*w(i, j, k).

The conversion units ADC(1)~ADC(M) receive the respective global bit line currents from the local bit line decoders D_LBL(1)~D_LBL(M) and convert into outputs (i.e. digital codes) OUT(1)~OUT(M). For example but not limited by, when the conversion units ADC(1)~ADC(M) have eight-bit resolution, the conversion units ADC(1)~ADC(M) convert the currents into eight-bit outputs OUT(1)~OUT(M). Thus, the output OUT(j) is represented as: $\Sigma_{i=1}^{i=N}\Sigma_{k=1}^{k=Q}$ IN(i)*w(i,j,k), wherein IN(i) represents the input data input into the word line WL(i) of the memory array 110. When the input data IN(i) is logic high, then the word line voltage VWL(i) is high-level voltage; and when the input data IN(i) is logic low, then the word line voltage VWL(i) is low-level voltage.

That is, the output OUT(j) of the conversion unit ADC(j) is related to the MAC operation result of the storage weights of the memory cells coupled to the same conversion unit ADC(j) and the corresponding word line voltages (input data).

Figure 2:
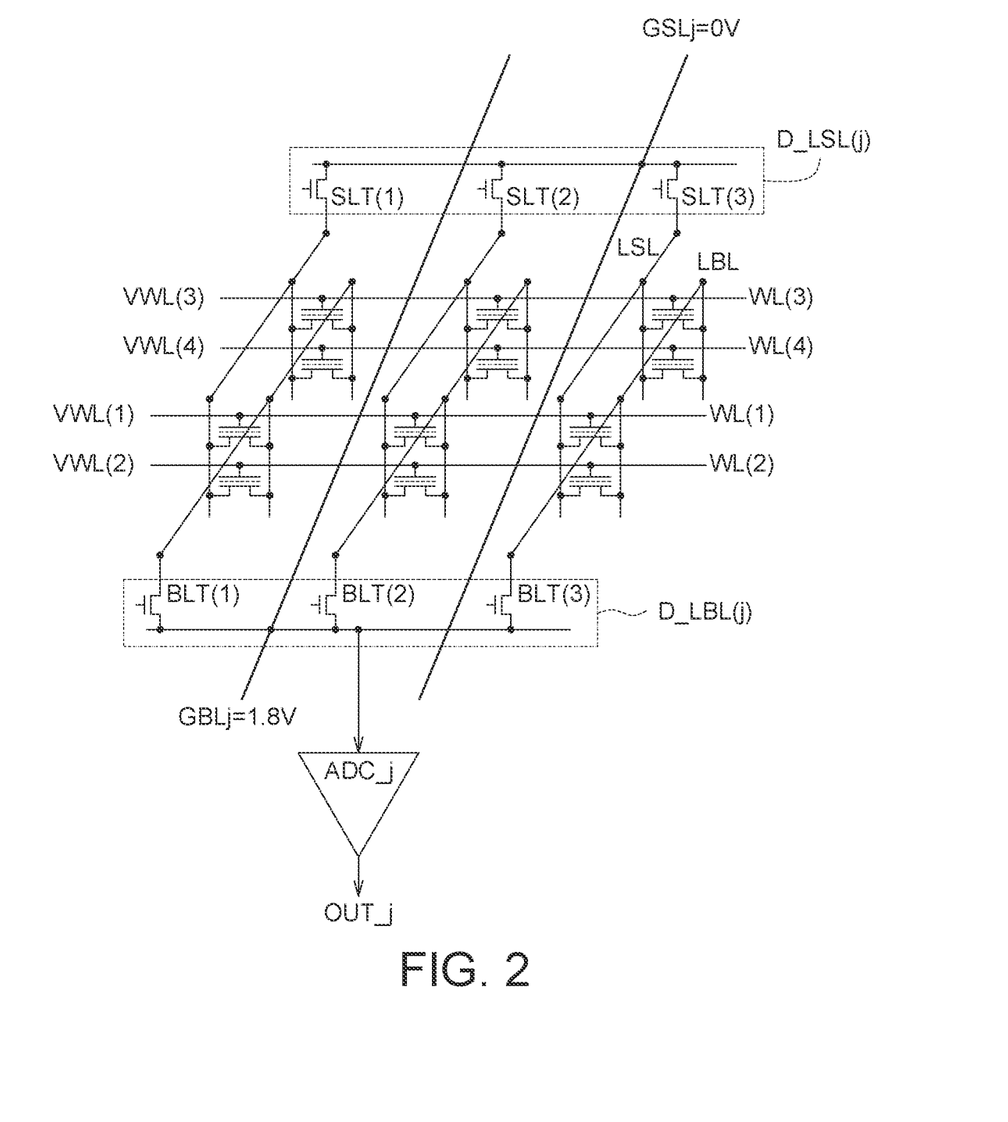
FIG. 2 shows MAC operations of a memory device according to one embodiment of the application.

FIG. 2 shows MAC operations of a memory device according to one embodiment of the application. As shown in FIG. 2, in MAC operations, the bit line transistors BLT(1)~BLT(3) and the source line transistors SLT(1)~SLT(3) are turned on, the global bit line voltage applied to the global bit line GBLj is 1.8V, and the global source line voltage applied to the global source line GSLj is 0V. The word line voltages VWL(1)~VWL(4) have high-level voltage of 2.8V and low-level voltage of 0V.

Thus, in FIG. 2, the global bit line current is: $\Sigma_{i=1}^{i=4}\Sigma_{k=1}^{k=3}$ VWL(i)*w(i, j, k).

From FIG. 2, the summed currents of the three bit line transistors BLT(1)~BLT(3) represents multi-level weights 0, 1, 2 and 3. That is, multi-level weight "0" represents two-level "00"; multi-level weight "1" represents two-level "01"; multi-level weight "2" represents two-level "10"; and multi-level weight "3" represents two-level "11". The memory cells store single-level weights 1 or 0.

Further, in order to present x-level weight, the number of the local bit lines coupled to the same conversion unit is: $Q=2^x-1$. For example, in order to present 4-level weight, the number of the local bit lines coupled to the same conversion unit is: $Q=2^4-1=15$.

In other words, in one embodiment of the application, even when the single-level cells are used, multi-level weight operations are also achieved. Thus, the embodiment of the application has advantage performing complex MAC operation by simple structure.

Figure 3:
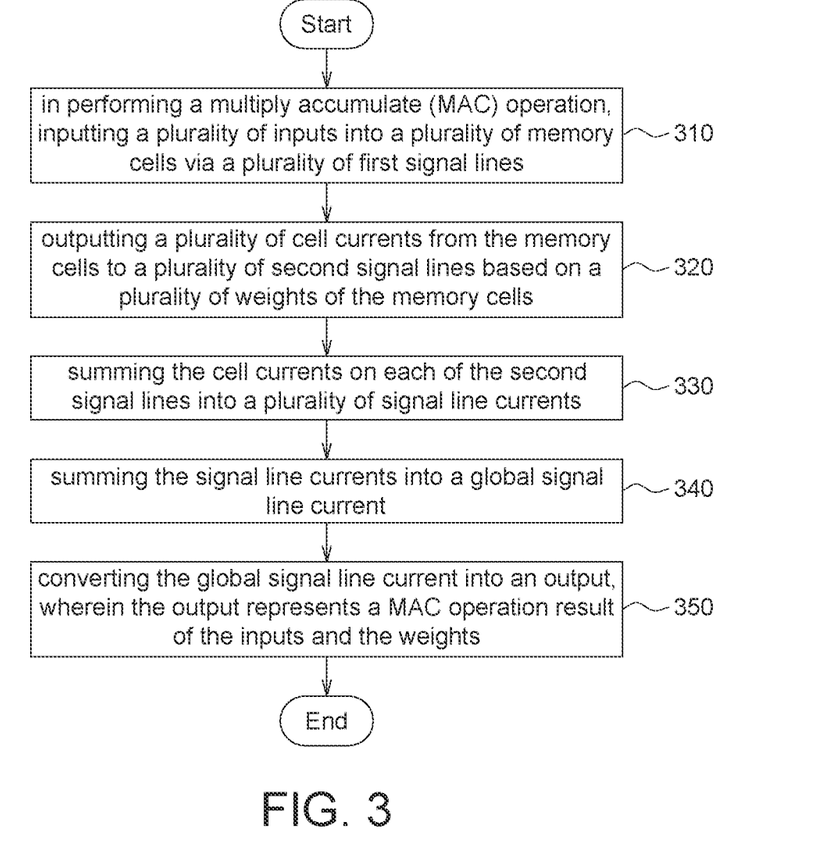
FIG. 3 shows an operation method for a memory device according to one embodiment of the application.

FIG. 3 shows an operation method for a memory device according to one embodiment of the application. The operation method comprises: in step 310, in performing a multiply accumulate (MAC) operation, inputting a plurality of inputs into a plurality of memory cells via a plurality of first signal lines; in step 320, outputting a plurality of cell currents from the memory cells to a plurality of second signal lines based on a plurality of weights of the memory cells; in step 330, summing the cell currents on each of the second signal lines into a plurality of signal line currents; in step 340, summing the signal line currents into a global signal line current; and in step 350, converting the global signal line current into an output, wherein the output represents a MAC operation result of the inputs and the weights.

Figure 4A:
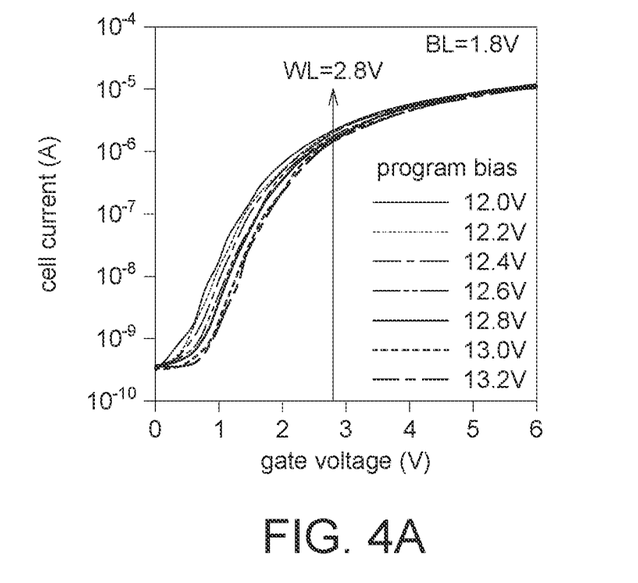
FIG. 4A to FIG. 4D show device performance characteristic diagram of a memory device according to one embodiment of the application.

FIG. 4A to FIG. 4D show device performance characteristic diagram of a memory device according to one embodiment of the application. In FIG. 4A, in one embodiment of the application, when the turned-on current (Ion) and the turned-off current (Ioff) of the memory cell has large difference (for example, (Ion/Ioff)>$10^4$), then more parallel summation are allowed and the background leakage is further reduced. Besides, by ISPP (Increment Step Programming Pulse), the threshold voltage is gradually increased. When the word line voltage is fixed at 2.8V, the cell current is gradually trimmed smaller.

Figure 4B:
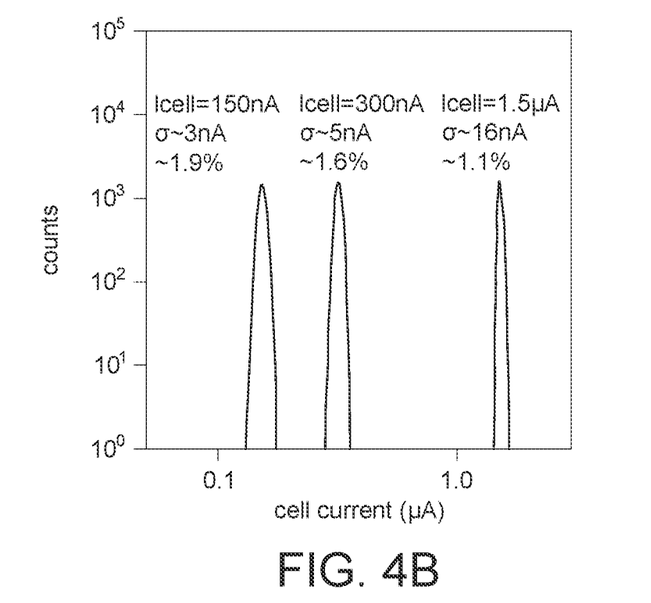

FIG. 4B shows tunable and tight cell current. As shown in FIG. 4B, the cell current Icell may be trimmed into different ranges, for example but not limited by, the range of the cell current Icell is from 150 nA to 1.5 μA. The cell current Icell has tight distribution. The cell current Icell has small standard deviation (σ) smaller than 2% (σ<2%).

Figure 4C:
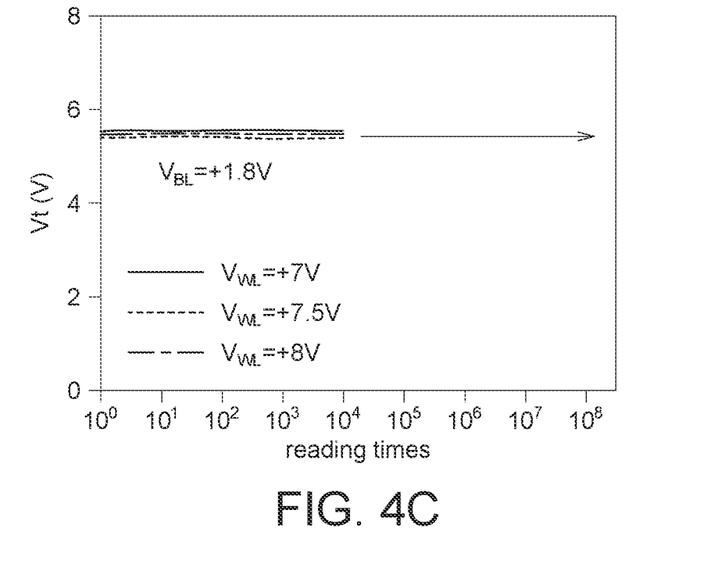

In FIG. 4C, in one embodiment of the application, the 3D AND type memory device is read-disturbance free, for example when the word line voltage is about +7V to +8V. For CIM memories, the read bias is about 2.8V which may further reduce read-disturbance.

Figure 4D:
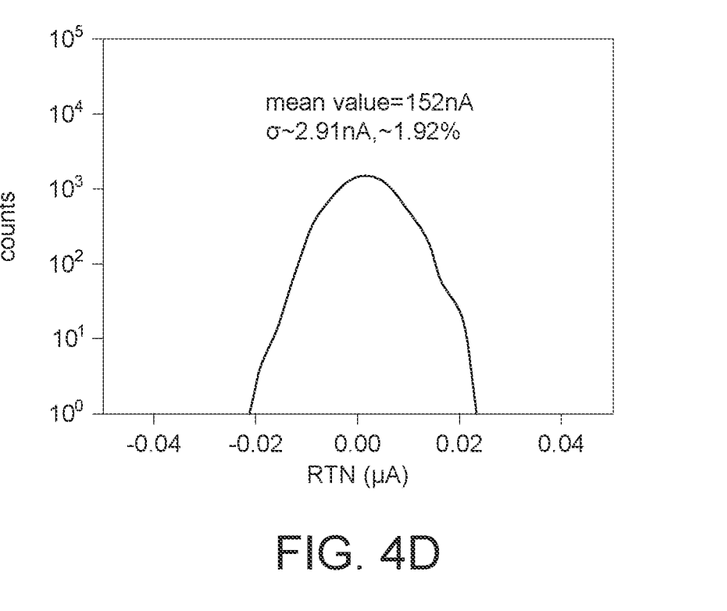

FIG. 4D shows, in one embodiment of the application, the memory device has small random telegraph noise (RTN). When the cell current Icell is about 150 nA, the RTN is about +/−0.02 μA, which is about 1.9% of the mean value.

Further, in one embodiment of the application, the word line voltage (for example but not limited by 2.8V) is generated by voltage dropping the operation voltage VCC (for example but not limited by 3.3V). Thus, no additional charge pumping is needed, and thus the circuit cost is reduced.

Further, in one embodiment of the application, 3D memory device provides parallel N*M MAC operation and high operation bandwidth.

Further, in one embodiment of the application, when more word line voltages and more ADC outputs are concurrently provided, the MAC operation capability are improved. For example, when one thousand word line voltages (N=1000) and one thousand ADC outputs (M=1000) are concurrently provided (about 8 Mb memory tile), then 1M MAC operations are calculated in a single read time (150 ns, 8-bit ADC has 150 ns read out period), which is about 6.7TOPS MAC operation capability, wherein TOPS refers Tera Operations Per Second and one TOPS refers to one tera (10^12) operations are processed in one second.

Still further, the memory device of one embodiment of the application may perform high speed MAC operations in consuming small memory circuit area. The memory device of one embodiment of the application has high operation speed with much cheaper circuit cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device comprising:
a memory array including a plurality of memory cells, the memory cells storing a plurality of weights, the memory cells being coupled to a plurality of word lines, a plurality of first signal lines and a plurality of second signal lines, the plurality of memory cells are controlled by the plurality of word lines;
a local signal line decoder coupled to the memory array and a global signal line; and a conversion unit coupled to the local signal line decoder and the global signal line;
wherein
in performing a multiply accumulate (MAC) operation, a plurality of inputs are input into the memory cells via the word lines;
the memory cells output a plurality of cell currents to the second signal lines based on the weights of the memory cells;
the cell currents on each of the second signal lines are summed into a plurality of signal line currents and input into the local signal line decoder;
the local signal line decoder sums the signal line currents into a global signal line current;
the conversion unit converts the global signal line current from the local signal line decoder into an output, wherein the output represents a MAC operation result of the inputs and the weights,
in presenting x-level weight of a weight unit comprising at least one memory cell among the plurality of memory cells, the at least one memory cell of the weight unit being coupled to a single one of the word lines, and the weight unit receiving a single input of the plurality of inputs via the single one of the word lines, a number of the second signal lines coupled to the same conversion unit is expressed as: $Q=2^x-1$, x and Q are both positive integers, Q is the number of the second signal lines coupled to the same conversion unit; and
the memory cells are single-level storage cells,
in performing the MAC operation, a plurality of transistors of the local signal line decoder are turned on.

2. The memory device according to claim 1, wherein each of the plurality of transistors of the local signal line decoder includes a first terminal coupled to one among the second signal lines, a second terminal coupled to the global signal line and an input of the conversion unit, and a control terminal for receiving a control signal.

3. The memory device according to claim 1, wherein the conversion unit is an analog-to-digital converter (ADC).

4. An operation method for a memory device, the operation method comprising:
in performing a multiply accumulate (MAC) operation, inputting a plurality of inputs into a plurality of memory cells via a plurality of word lines, the plurality of memory cells are controlled by the plurality of word lines;
outputting a plurality of cell currents from the memory cells to a plurality of second signal lines based on a plurality of weights of the memory cells;
summing the cell currents on each of the second signal lines into a plurality of signal line currents;
summing the signal line currents into a global signal line current;
converting the global signal line current into an output by a conversion unit, wherein the output represents a MAC operation result of the inputs and the weights,
in presenting x-level weight of a weight unit comprising at least one memory cell among the plurality of memory cells, the at least one memory cell of the weight unit being coupled to a single one of the word lines, and the weight unit receiving a single input of the plurality of inputs via the single one of the word lines, a number of the second signal lines coupled to the same conversion unit is expressed as: $Q=2^x-1$, x and Q are both positive integers, Q is the number of the second signal lines coupled to the same conversion unit; and the memory cells are single-level storage cells, in performing the MAC operation, a plurality of transistors of the local signal line decoder are turned on.

5. The operation method for the memory device according to claim 4, wherein in performing the MAC operation, a local signal line decoder sums the signal line currents into the global signal line current.

6. The operation method for the memory device according to claim 5, wherein the conversion unit converts the global signal line current into the output; and each of the plurality of transistors of the local signal line decoder includes a first terminal coupled to one among the second signal lines, a second terminal coupled to a global signal line and an input of the conversion unit, and a control terminal for receiving a control signal.

7. The operation method for the memory device according to claim 4, wherein the conversion unit is an analog-to-digital converter (ADC).

8. A memory device comprising:

a memory array including a plurality of memory cells, the memory cells storing a plurality of weights, the memory cells being coupled to a plurality of word lines, a plurality of first signal lines and a plurality of second signal lines, the plurality of memory cells are controlled by the plurality of word lines;

at least one first local signal line decoder coupled to the memory array and at least one first global signal line; and at least one conversion unit coupled to the at least one first local signal line decoder and the at least one first global signal line, wherein in presenting x-level weight of a weight unit comprising at least one memory cell among the plurality of memory cells, the at least one memory cell of the weight unit being coupled to a single one of the word lines, and the weight unit receiving a single input of the plurality of inputs via the single one of the word lines, a number of the second signal lines coupled to the same conversion unit is expressed as: $Q=2^x-1$, x and Q are both positive integers, Q is the number of the second signal lines coupled to the same conversion unit; and the memory cells are single-level storage cells, in performing the MAC operation, a plurality of transistors of the local signal line decoder are turned on.

9. The memory device according to claim 8, wherein in performing a multiply accumulate (MAC) operation, a plurality of inputs are input into the memory cells via the word lines;

the memory cells output a plurality of cell currents to the second signal lines based on the weights of the memory cells;

the cell currents on each of the second signal lines are summed into a plurality of signal line currents and input into the at least one first local signal line decoder;

the at least one first local signal line decoder sums the signal line currents into a global signal line current; and the at least one conversion unit converts the global signal line current from the at least one first local signal line decoder into an output, wherein the output represents a MAC operation result of the inputs and the weights.

10. The memory device according to claim 8, wherein the memory device is a 3D (three-dimension) AND memory device.

11. The memory device according to claim 8, wherein the at least one first global signal line includes a plurality of first global signal lines and the at least one conversion unit includes a plurality of conversion units, each of the first global signal lines is coupled to each of the conversion units.

12. The memory device according to claim 9, wherein each of the plurality of first transistors of the at least one first local signal line decoder includes a first terminal coupled to one among the second signal lines, a second terminal coupled to the at least one first global signal line and an input of the at least one conversion unit, and a control terminal for receiving a control signal.

13. The memory device according to claim 8, wherein the at least one conversion unit is an analog-to-digital converter (ADC).

14. The memory device according to claim 8, further including at least one second local signal line decoder having a plurality of second transistors, each of the plurality of second transistors of the at least one second local signal line decoder including a first terminal coupled to one among a plurality of third signal lines, a second terminal coupled to at least one second global signal line, and a control terminal for receiving a control signal.

* * * * *